US010847337B2

(12) United States Patent
Shono et al.

(10) Patent No.: US 10,847,337 B2
(45) Date of Patent: Nov. 24, 2020

(54) SIDE INJECT DESIGNS FOR IMPROVED RADICAL CONCENTRATIONS

(71) Applicant: Applied Materials, Inc., Santa Clara, CA (US)

(72) Inventors: Eric Kihara Shono, San Mateo, CA (US); Vishwas Kumar Pandey, Madhya Pradesh (IN); Christopher S. Olsen, Fremont, CA (US); Hansel Lo, San Jose, CA (US); Agus Sofian Tjandra, San Jose, CA (US); Taewan Kim, San Jose, CA (US); Tobin Kaufman-Osborn, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/248,384

(22) Filed: Jan. 15, 2019

(65) Prior Publication Data

US 2019/0228942 A1 Jul. 25, 2019

Related U.S. Application Data

(60) Provisional application No. 62/621,460, filed on Jan. 24, 2018.

(30) Foreign Application Priority Data

Jan. 30, 2018 (IN) ............................ 201841003399

(51) Int. Cl.
*H01J 37/04* (2006.01)
*H01L 21/67* (2006.01)
*H01J 37/20* (2006.01)

(52) U.S. Cl.
CPC .............. *H01J 37/04* (2013.01); *H01J 37/20* (2013.01); *H01L 21/67017* (2013.01); *H01L 21/67115* (2013.01); *H01J 2237/061* (2013.01)

(58) Field of Classification Search
USPC .................................................... 250/453.11
See application file for complete search history.

(56) References Cited

U.S. PATENT DOCUMENTS 6,450,116 B1 * 9/2002 Noble ...................... C23C 8/36 118/50.1
8,070,879 B2 12/2011 Chen et al.
(Continued)

FOREIGN PATENT DOCUMENTS

JP 2003133302 A 5/2003
JP 2007242871 A 9/2007

OTHER PUBLICATIONS

International Search Report issued to PCT/US2019/013816 dated May 8, 2019.

*Primary Examiner* — Phillip A Johnston
(74) *Attorney, Agent, or Firm* — Patterson + Sheridan, LLP

(57) ABSTRACT

In one example, a chamber inlet assembly includes a chamber inlet, an outer coupling for a delivery line, and an inner coupling for a processing region of a processing chamber. The inner coupling and the outer coupling are on inner and outer ends, respectively, of the chamber inlet, wherein a cross-sectional area of the inner coupling is larger than a cross-sectional area of the outer coupling. The chamber inlet assembly also includes a longitudinal profile including the inner and outer ends and a first side and a second side, the first and second sides being on opposite sides of the chamber inlet, wherein a shape of the longitudinal profile comprises at least one of triangular, modified triangular, trapezoidal, modified trapezoidal, rectangular, modified rectangular, rhomboidal, and modified rhomboidal. The chamber inlet assembly also includes cassette including the chamber inlet and configured to set into a side wall of the processing chamber.

20 Claims, 10 Drawing Sheets

172 121 121 119 119 119 102 100 198 120 118 194 116 117 184 180 192 153 114 188 182 174 186 122 113 141 141 141 101 162 197 173 190 168 183 185 196 167 163 111 175 189 187 160 115 171 165 164 166 170 169

(56) References Cited

U.S. PATENT DOCUMENTS

| | | | | |
|---|---|---|---|---|
| 8,741,785 | B2 * | 6/2014 | Olsen | H01L 21/02252 438/776 |
| 2002/0073925 | A1 | 6/2002 | Noble et al. | |
| 2013/0040444 | A1 | 2/2013 | Rogers et al. | |
| 2013/0109162 | A1 | 5/2013 | Rogers et al. | |
| 2016/0217981 | A1 | 7/2016 | Nguyen et al. | |
| 2018/0347045 | A1 | 12/2018 | Olsen et al. | |
| 2019/0139745 | A1 * | 5/2019 | Gong | H01J 37/32899 |
| 2020/0203132 | A1 * | 6/2020 | Ye | H01J 37/32577 |

* cited by examiner

SIDE INJECT DESIGNS FOR IMPROVED RADICAL CONCENTRATIONS

CROSS REFERENCE TO RELATED APPLICATIONS

This application claims benefit of U.S. provisional patent application Ser. No. 62/621,460, filed Jan. 24, 2018, and Indian provisional patent application serial number 201841003399 filed Jan. 30, 2018, which is incorporated by reference in its entirety.

BACKGROUND

Field

Embodiments of the present disclosure generally relate to manufacturing semiconductor devices. More specifically, embodiments described herein relate to manufacture of floating gate NAND memory devices and other transistor gate structures using an improved side inject for ions, radicals, and electrons from a remote plasma source.

Description of the Related Art

Flash memory, such as NAND flash memory devices, is a commonly used type of non-volatile memory in widespread use for mass storage applications. The NAND flash memory devices typically have a stacked type gate structure in which a tunnel oxide (TO), a floating gate (FG), an inter-poly dielectric (IPD), and a control gate (CG) are sequentially stacked on a semiconductor substrate. The floating gate, the tunnel oxide, and the underlying portion of the substrate generally form a cell (or memory unit) of the NAND flash memory device. A shallow trench isolation (STI) region is disposed in the substrate between each cell adjacent to the tunnel oxide and the floating gate to separate the cell from adjacent cells. During writing of the NAND flash memory devices, a positive voltage is applied to the control gate which draws electrons from the substrate into the floating gate. For erasing data of the NAND flash memory devices, a positive voltage is applied to the substrate to discharge electrons from the floating gate and through the tunnel oxide. The flow of electrons is sensed by a sensing circuitry and results in the returns of "0" or "1" as current indicators. The amount of electrons in the floating gate and "0" or "1" characteristics form the basis for storing data in the NAND flash memory devices.

The floating gate is typically isolated from the semiconductor substrate by the tunnel oxide and from the control gate by the inter-poly dielectric, which prevents the leakage of electrons between, for example, the substrate and the floating gate or the floating gate and the control gate. To enable continued physical scaling of the NAND flash memory device, a nitridation process has been used by the industry to incorporate nitrogen into the surface of the floating gate to improve the reliability of the tunnel oxide or to suppress dopant diffusion out of the floating gate. However, the nitridation process also undesirably incorporates nitrogen into shallow trench isolation regions. Nitrogen incorporated in the shallow trench isolation region between neighboring floating gate structures forms a charge leakage path which can negatively impact final device performance.

In general, plasmas generated by, for example, an energetic excitation of gaseous molecules, contain a plasma of charged ions, radicals, and electrons. Radicals of a plasma generally react in a much more desirable manner with silicon, polysilicon, or silicon nitride material on a substrate, than ions or a mixture of radicals and ions. In that regard, it would be beneficial to eliminate the majority of the ions of the plasma such that only radicals of the plasma react with silicon, polysilicon, or silicon nitride material on a substrate, thereby obtaining a greater selectivity of processing of silicon or polysilicon material on the substrate.

Many current substrate processing systems include a remote plasma source coupled to a processing chamber through a side inject. Ideally, radicals from the remote plasma source travel through the side inject to the processing chamber and then flow over and across the surface of the substrate. In many current substrate processing systems, the configuration of the side inject may cause significant radical loss due, at least in part, to a restricted shape/size of a coupling adaptor (between the side inject and the processing chamber). For example, the configuration may result in a significant amount of volume-surface recombination before the radicals reach the processing chamber. Some current substrate processing systems may exacerbate the volume-surface recombinations by creating back-pressure from the RPS to the processing chamber (see U.S. Pat. No. 6,450,116 to Nobel, et. al.)

It would be beneficial to improve the configuration of the side inject and/or the adaptor piece to give greater radical availability over the substrate by reducing or minimizing the volume-surface recombination.

SUMMARY

A chamber inlet assembly for a substrate processing system includes a chamber inlet; an outer coupling for a delivery line; an inner coupling for a processing region of a processing chamber, the inner coupling and the outer coupling being on inner and outer ends, respectively, of the chamber inlet, wherein a cross-sectional area of the inner coupling is larger than a cross-sectional area of the outer coupling; a longitudinal profile comprising the inner and outer ends and a first side and a second side, the first and second sides being on opposite sides of the chamber inlet, wherein a shape of the longitudinal profile comprises at least one of triangular, modified triangular, trapezoidal, modified trapezoidal, rectangular, modified rectangular, rhomboidal, modified rhomboidal; and a cassette including the chamber inlet and configured to set into a side wall of the processing chamber.

An inlet member for a delivery line for a substrate processing system includes a first end for coupling to a mounting sleeve of the delivery line; a second end for coupling to a processing chamber; and an inlet passageway extending from the first end to the second end, wherein: the inlet passageway comprises a cylindrical portion proximate the first end, the inlet passageway comprises a conical portion proximate the second end, and a first cross-sectional area at the first end is less than a second cross-sectional area at the second end.

A substrate processing system includes a delivery line coupled between a processing chamber and a remote plasma source; the processing chamber comprising a side wall; and a chamber inlet assembly set into the side wall, the chamber inlet assembly comprising: a chamber inlet; an outer coupling to the delivery line; an inner coupling for a processing region of the processing chamber, the inner coupling and the outer coupling being on inner and outer ends, respectively, of the chamber inlet, wherein a cross-sectional area of the inner coupling is larger than a cross-sectional area of the outer coupling; a longitudinal profile comprising the inner and outer ends and a first side and a second side, the first and second sides being on opposite sides of the chamber inlet, wherein a shape of the longitudinal profile comprises at least one of triangular, modified triangular, trapezoidal, modified trapezoidal, rectangular, modified rectangular, rhomboidal, modified rhomboidal; and a cassette including the chamber inlet and configured to set into the side wall.

A substrate processing system includes a processing chamber; and a delivery line coupled between the processing chamber and a remote plasma source, the delivery line comprising: a mounting sleeve coupled to the remote plasma source; and an inlet member, the inlet member comprising: a first end for coupling to the mounting sleeve; a second end for coupling to the processing chamber; and an inlet passageway extending from the first end to the second end, wherein: the inlet passageway comprises a cylindrical portion proximate the first end, the inlet passageway comprises a conical portion proximate the second end, and a first cross-sectional area at the first end is less than a second cross-sectional area at the second end.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
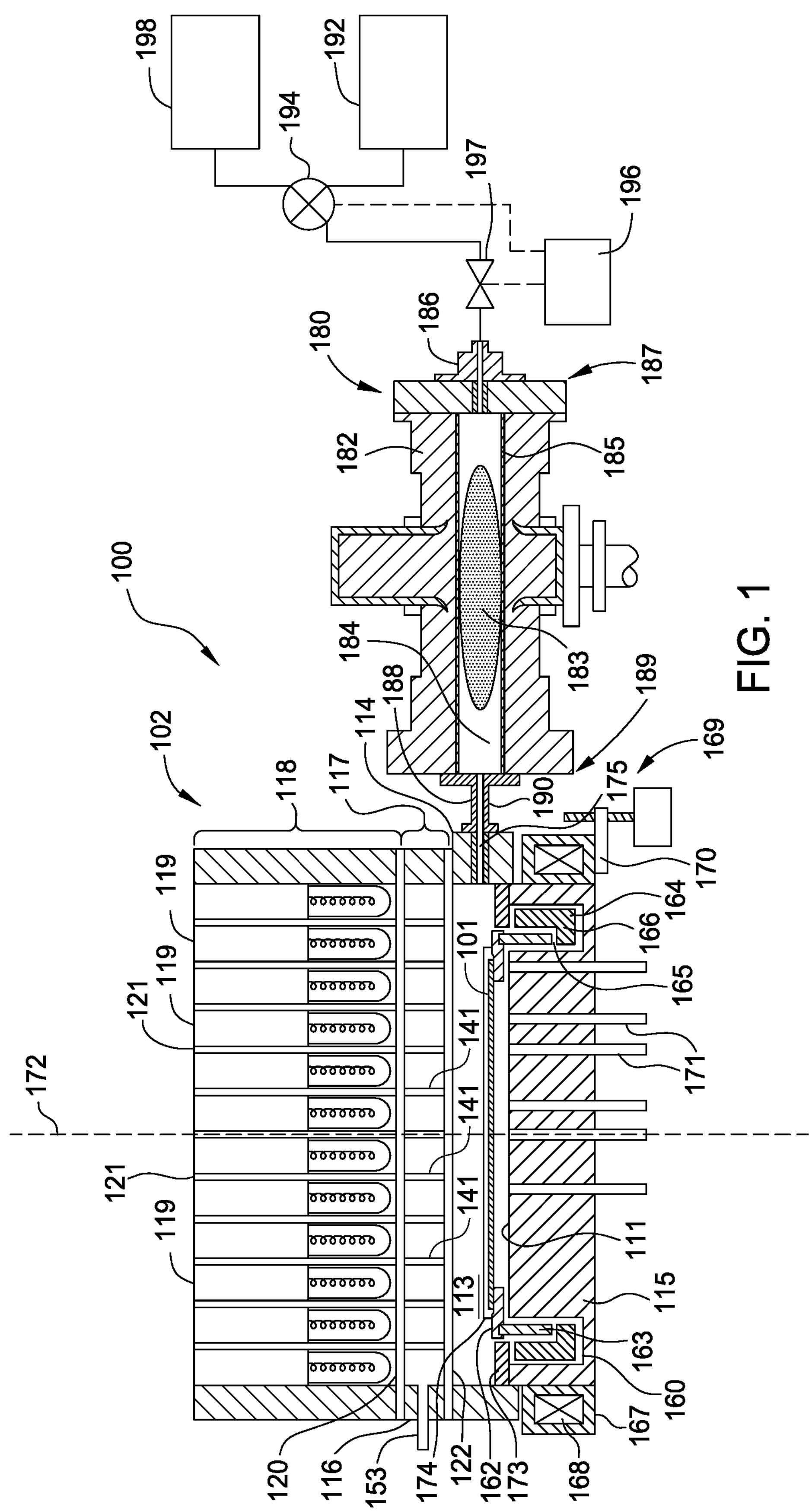
FIG. 1 illustrates a substrate processing system according to embodiments disclosed herein.

This patent application describes an apparatus and method for incorporating radicals of a plasma into a substrate or a material on a semiconductor substrate using a precursor activator such as a remote plasma source ("RPS"). In general, a plasma is a gaseous material consisting of ions, radicals, electrons, and neutral molecules. Radicals of a plasma generally react in a more desirable manner with silicon or polysilicon material on a substrate, than ions or a mixture of radicals and ions. In that regard, the apparatus and methods described herein eliminate the majority of the ions of the plasma such that primarily radicals of the plasma react with silicon or polysilicon material on a substrate to improve selectivity of processing of silicon or polysilicon material on the substrate.

The apparatus and methods described herein can be used for the manufacture of semiconductor devices and structures suitable for narrow pitch applications. As used herein, narrow pitch applications include half-pitches of 32 nm or less (e.g., device nodes of 32 nm or less). The term "pitch" as used herein refers to a measure distance between the parallel structures or the adjacent structures of the semiconductor device. The pitch may be measured from side to side of the same side of the adjacent or substantially parallel structures. The semiconductor devices and structures may be utilized in applications having greater pitches as well. The semiconductor devices may be, for example, NAND or NOR flash memory, or other suitable devices.

Plasmas generally contain charged gaseous species (e.g., ions-cations or anions) and non-charged gaseous species (e.g., radicals, excited neutrals, and non-excited neutrals). In many embodiments, the charged gaseous species may be reduced or removed from the plasma species prior to treating the substrate to a stabilization process described by embodiments herein. The non-charged gaseous species are utilized in the nitridation or oxidation of doped layers and other material layers during the stabilization processes. The non-charged gaseous species include, but are not limited to radicals (e.g., atomic-N, $NH_2$, NH, $N_3$, atomic-O, $O_3$), excited neutrals (e.g., $N_2$*, $NH_3$*, or $O_2$*), and non-excited neutrals (e.g., $N_2$, $NH_3$, or $O_2$). The excited neutrals within the non-charged gaseous species may be excited thermally, electronically, or combinations thereof by an excitation process, which may form a plasma or an activated gas mixture.

The terms "radical" or "free radical", as used herein, refers to an electrically uncharged or valence neutral atom, molecule, or molecular fragment having at least one unpaired electron.

The term "ion", as used herein, refers to an electrically charged atom, molecule, or molecular fragment formed by the gain or loss of at least one electron from a neutral valence state.

Ions have high chemical activity compared to radicals and compared to the bond energies listed above ($1^{st}$ ionization energy of $N_2$=1402 kJ/mol; atomization energy of $N_2$=473 kJ/mol), so ions generally energize more chemical reactions than radicals. Radicals can be selected to energize, or participate in, certain chemical reactions while not participating in other chemical reactions based on reaction energies and chemical potential of the radicals.

High radical density versus ion density may be achieved by a high pressure plasma process using, for example, a pressure within a range from about 0.3 Torr to about 20 Torr, for example, about 5 Torr or greater. The high pressure encourages ions to recombine with electrons quickly, leaving neutral radical species and inactivated species. In some embodiments, a radical gas is formed. In some embodiments, a RPS may be used to generate radical species by various methods. The RPS, for example a microwave, RF, or thermal system, may be connected to a processing chamber through a delivery line.

Exemplary Substrate Processing System

FIG. 1 illustrates a substrate processing system 100. The substrate processing system 100 includes a processing chamber 102 and a precursor activator 180 that couples to the chamber 102 and is used to remotely provide radicals (e.g., O*) of a plasma to the chamber 102. The precursor activator 180 can also be used to provide an activated gas mixture that is not a plasma, for example by applying energy to a gas that does not significantly ionize the gas. The chamber 102 has a processing region 113 enclosed by one or more side walls 114 (e.g., four side walls) and a base 115. The upper portion of side wall 114 may be sealed to a window assembly 117 (e.g., using "O" rings). A radiant energy assembly 118 is positioned over and coupled to window assembly 117. The radiant energy assembly 118 has a plurality of lamps 119, which may be tungsten halogen lamps, each mounted into a receptacle 121 and positioned to emit electromagnetic radiation into the processing region 113. The window assembly 117 of FIG. 1 has a plurality of short light pipes 141, but the window assembly 117 may just have a flat, solid window with no light pipes. The window assembly 117 has an outer wall 116 (e.g., a cylindrical outer wall) that forms a rim enclosing the window assembly 117 around a circumference thereof. The window assembly 117 also has a first window 120 covering a first end of the light pipes 141 and a second window 122 covering a second end of the light pipes 141, opposite the first end. The first window 120 and second window 122 extend to, and engage with, the outer wall 116 of the window assembly 117 to enclose and seal the interior of the window assembly 117, which includes the light pipes 141. In such cases, when light pipes are used, a vacuum can be produced in the plurality of light pipes 141 by applying vacuum through a conduit 153 through the outer wall 116 to one of the light pipes 141, which is in turn fluidly connected to the rest of the pipes.

A substrate 101 is supported in the chamber 102 by a support ring 162 within the processing region 113. The support ring 162 is mounted on a rotatable cylinder 163. By rotating the cylinder 163, the support ring 162 and substrate 101 are caused to rotate during processing. The base 115 of the chamber 102 has a reflective surface 111 for reflecting energy onto the backside of the substrate 101 during processing. Alternatively, a separate reflector (not shown) can be positioned between the base 115 of the chamber 102 and the support ring 162. The chamber 102 may include a plurality of temperature probes 171 disposed through the base 115 of the chamber 102 to detect the temperature of the substrate 101. In the event a separate reflector is used, as described above, the temperature probes 171 are also disposed through the separate reflector for optical access to electromagnetic radiation coming from the substrate 101.

The cylinder 163 is supported by a magnetic rotor 164, which is a cylindrical member having a ledge 165 on which the cylinder 163 rests when both members are installed in the chamber 102. The magnetic rotor 164 has a plurality of magnets in a magnet region 166 of the magnetic rotor 164 below the ledge 165. The magnetic rotor 164 is disposed in an annular well 160 located at a peripheral region of the chamber 102 along the base 115. A cover 173 rests on a peripheral portion of the base 115 and extends over the well 160 toward the cylinder 163 and support ring 162, leaving a tolerance gap between the cover 173 and the cylinder 163 and/or the support ring 162. The cover 173 generally protects the magnetic rotor 164 from exposure to process conditions in the processing region 113.

The magnetic rotor 164 is rotated by magnetic energy from a magnetic stator 167 disposed around the base 115. The magnetic stator 167 has a plurality of electromagnets 168 that, during processing of the substrate 101, are powered according to a rotating pattern to form a rotating magnetic field that provides magnetic energy to rotate the magnetic rotor 164. The magnetic stator 167 is coupled to a linear actuator 169, which in this case is a screw drive, by a support 170. Operating the linear actuator 169 moves the magnetic stator 167 along an axis 172 of the chamber 102, which in turn moves the magnetic rotor 165, the cylinder 163, the support ring 162, and the substrate 101 along the axis 172.

Processing gas is provided to the chamber 102 through a chamber inlet 175, and exhausts through a chamber outlet oriented out of the page and generally along the same plane as the chamber inlet 175 and the support ring 162 (not shown in FIG. 1). Substrates enter and exit the chamber 102 through an access port 174 formed in the side wall 114 and shown at the rear in FIG. 1. The substrate transportation process is not described herein.

The precursor activator 180 has a body 182 surrounding an interior space 184 where an activated precursor mixture 183 of ions, radicals, and electrons can be formed by application of plasma formation energy. A liner 185 made of quartz or sapphire protects the body 182 from chemical attack by the plasma. The interior space 184 preferably does not have any electrical potential gradient present that might attract charged particles, e.g., ions. A gas inlet 186 is disposed at a first end 187 of the body 182 and opposite from a gas outlet 188 that is located at a second end 189 of the body 182. When the precursor activator 180 is coupled to the chamber 102, the gas outlet 188 is in fluid communication with the chamber 102 through a delivery line 190 to chamber inlet 175, such that radicals of the activated precursor mixture 183 generated within the interior space 184 are supplied to the processing region 113 of the chamber 102. The gas outlet 188 may have a diameter larger than the gas inlet 186 to allow the excited radicals to be efficiently discharged at a desired flow rate, and to minimize the contact between the radicals and the liner 185. If desired, a separate orifice may be inserted within the liner 185 at the gas outlet 188 to reduce an inner dimension of the interior space 184 at the gas outlet 188. The diameter of the gas outlet 188 (or orifice, if used) can be selected to provide a pressure differential between the processing region 113 and the precursor activator 180. The pressure differential may be selected to yield a composition of ions, radicals, and molecules flowing in to the chamber 102 that is suitable to processes being performed in the chamber 102.

To provide gas for plasma processing, a first gas source 192 is coupled to the gas inlet 186 via a first input of a three-way valve 194 and a valve 197 used to control the flow rate of gas released from the first gas source 192. A second input of the three-way valve 194 may be coupled to a second gas source 198. Each of the first gas source 192 and second source 198 may be, or include, one or more of a nitrogen-containing gas, an oxygen-containing gas, a hydrogen-containing gas, a silicon-containing gas, or a plasma forming gas such as argon or helium. A flow controller 196 is connected to the three-way valve 194 to switch the valve between its different positions, depending upon which process is to be carried out. The flow controller 196 also controls switching of the three-way valve 194.

The precursor activator 180 may be coupled to an energy source (not shown) to provide an excitation energy, such as an energy having a microwave or RF frequency, to the precursor activator 180 to activate the process gas traveling from the first gas source 192 into the activated precursor mixture 183. In the case where nitrogen-containing gas, for example, $N_2$, is used, the activation in precursor activator 180 produces N* radicals, positively charged ions such as $N^+$ and $N_2^+$, and electrons in the interior space 184. By locating the precursor activator 180 remotely from the processing region 113 of chamber 102, exposure of the substrate to ions can be minimized. Ions can damage sensitive structures on a semiconductor substrate, whereas radicals are reactive and can be used to perform beneficial chemical reactions. Use of a RPS such as the precursor activator 180 promotes exposure of the substrate 101 to radicals and minimizes exposure of the substrate 101 to ions.

Figure 2:
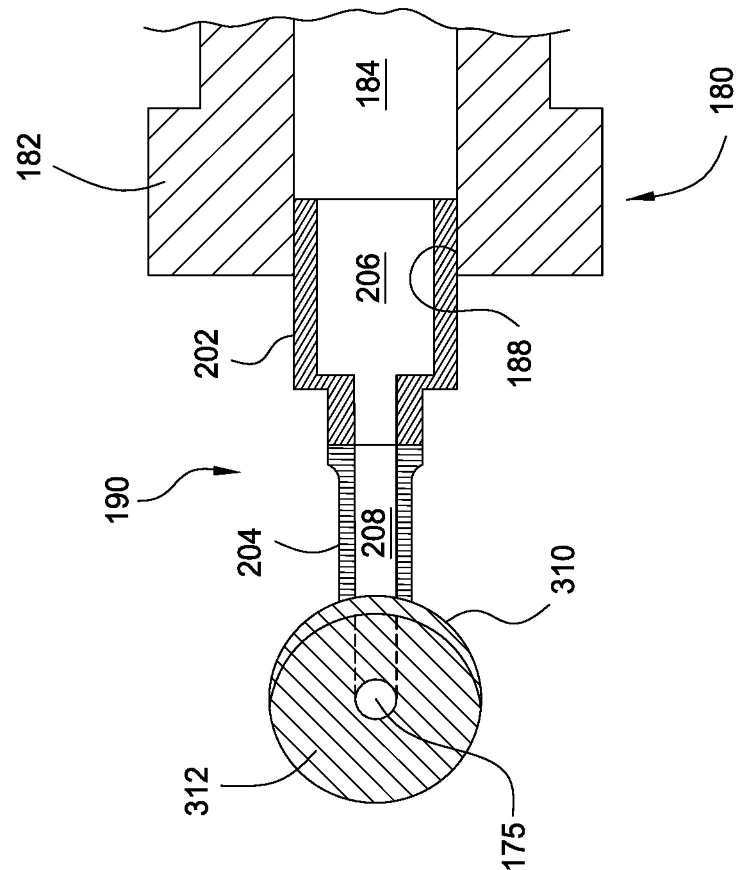
FIG. 2 illustrates a schematic and cross-sectional view of a delivery line of the substrate processing system of FIG. 1.

Using an angled delivery line 190 may promote ion collisions and reduce ion concentration in the plasma flowing from the precursor activator 180 to the chamber 102. By using an angled delivery line 190, all or the majority of ions generated by the excitation of the process gas become charge neutral before reaching the processing region 113. FIG. 2 illustrates a schematic and cross-sectional view of the delivery line 190. The delivery line 190 has a mounting sleeve 202 and an inlet member 204 connected to the mounting sleeve 202. Each of the mounting sleeve 202 and the inlet member 204 is a hollow body defining a longitudinally extending space, for example, sleeve passageway 206 and inlet passageway 208. The cross-sectional profile of the passageways 206, 208 may be any shape, symmetric or asymmetric, including but not limited to, circular, oval, square, rectangular, or irregular. One end of the mounting sleeve 202 is fastened to the gas outlet 188 of the body 182 of the precursor activator 180 (partially shown) so that the sleeve passageway 206 of the mounting sleeve 202 is aligned with and fluidly coupled to the interior space 184 at the gas outlet 188. Another end of the mounting sleeve 202 is connected to the inlet member 204 so that the inlet passageway 208 of the inlet member 204 is substantially aligned with, and fluidly coupled to, the sleeve passageway 206 of the mounting sleeve 202. An inner diameter of the mounting sleeve 202 may be reduced along the longitudinal axis of the mounting sleeve 202 to match both the inner diameter of the precursor activator 180 and the inner diameter of the inlet member 204. The mounting sleeve 202 and the inlet member 204 may be made of a material that does not cause recombination of the radicals, such as N*, O*, or H* radicals. For example, the mounting sleeve 202 and the inlet member 204 may be made of, or provided with, a liner made of, silicon, silicon oxide (for example quartz), silicon nitride, boron nitride, carbon nitride, sapphire or alumina ($Al_2O_3$). While the delivery line 190 is shown and described as two separate components (i.e., the mounting sleeve 202 and the inlet member 204) being connected to one another, the delivery line 190 may be a single-piece integrated body with a passageway connecting to the chamber inlet 175 of the chamber 102.

Figure 3:
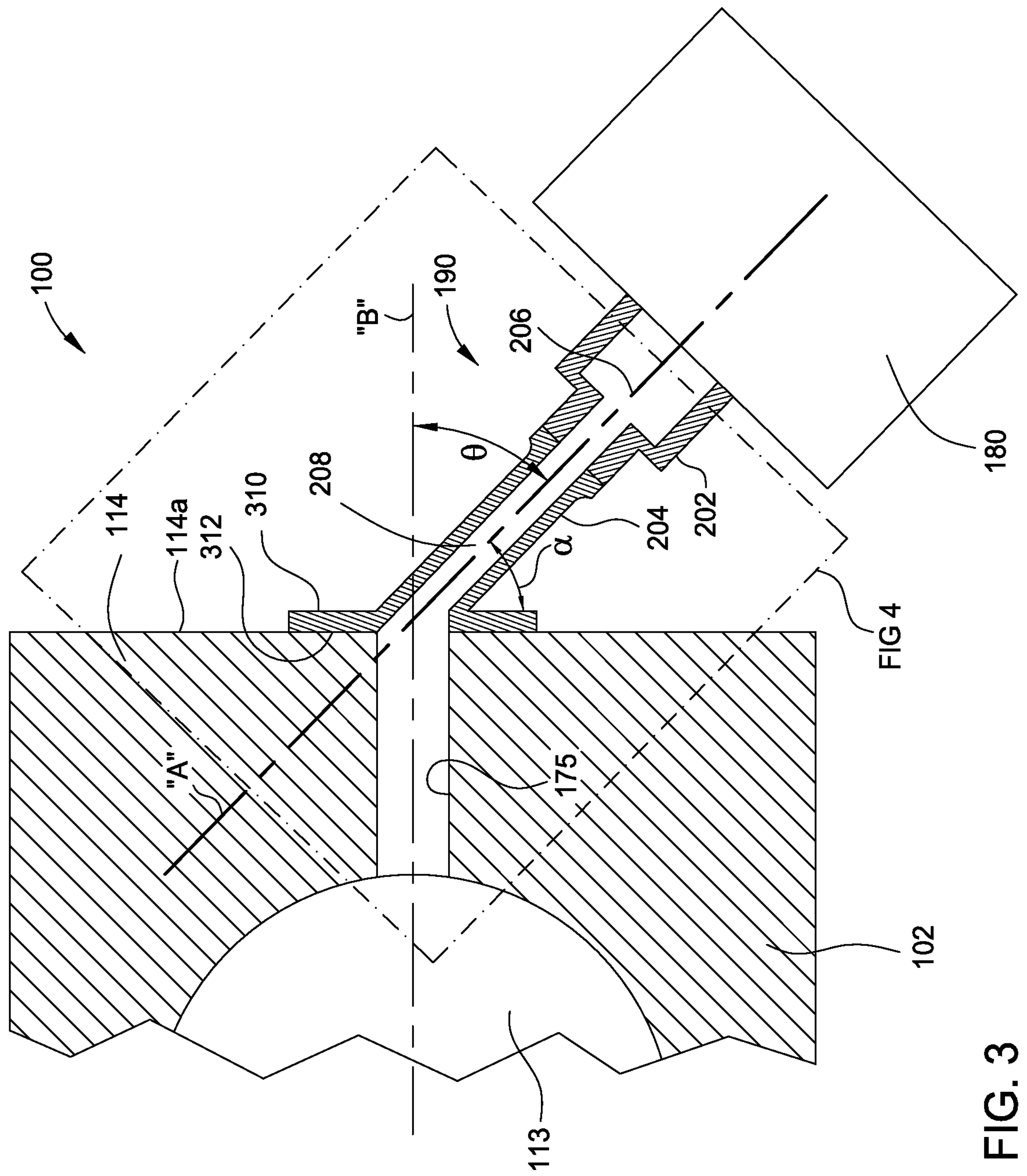
FIG. 3 is a schematic top view of the substrate processing system of FIG. 1.

FIG. 3 is a schematic top view of the substrate processing system 100. The inlet member 204 may be configured as an adapter to couple to the chamber inlet 175 at the side wall 114 of the chamber 102. The inlet member 204 includes a flange 310 connected to, and extending wholly around, the outer surface of the delivery line 190 at the side wall 114. A portion of the inlet member 204 may extend into a recess (not shown) formed in the side wall 114 such that a face 312 of the flange 310 is bolted into the recess of the side wall 114. Alternatively, the recess may be omitted, and the face 312 of the flange 310 may be bolted to the exterior surface

**114*a* of the side wall 114 and configured such that the inlet passageway 208 is fluidly coupled to the chamber inlet 175. In either case, the delivery line 190 is coupled to the chamber inlet 175 with an angled pipe structure, such that a longitudinal axis "A" of the inlet passageway 208 in the inlet member 204 and a longitudinal axis "B" of the chamber inlet 175 intersect at an angle θ. The flange 310 extends at a desired angle "a" relative to the longitudinal axis "A" of the inlet passageway 208. The angle α may be selected to provide clearance between the inlet member 204 and the side wall 114 in the event the flange 310 is coupled to the chamber 102 in the recess. The angle α may range from about 20 degrees to about 80 degrees, such as about 45 degrees to about 70 degrees. The angle θ may range between about 10 degrees and about 70 degrees, such as about 20 degrees and about 45 degrees. In one example, the angle α is about 45 degrees or above, for example about 60 degrees. Having the delivery line 190 positioned at an angle relative to the chamber inlet 175 promotes collision of ions or reaction of ions with electrons or other charged particles during collisions at the interior surface of the chamber inlet 175. Therefore, concentration of ions entering the processing region 113** is reduced, in some cases substantially to zero.

In addition to the angled pipe structure described above, ion collision may be promoted by selecting a length of the delivery line 190 such that, for a given flow rate of a process gas (e.g., a given plasma generation rate), residence time of the plasma in the delivery line 190 is substantially longer than an average time for the ions to recombine with electrons in the plasma. The length of the delivery line 190 (and/or the interior space 184 of the precursor activator 180) needed to extinguish substantially all the ions of a plasma at a given source gas flow rate may be determined experimentally or by lifetime calculations. In one embodiment, the interior space 184 has a length of about 5 inches to about 12 inches, for example about 8 inches, with an inside diameter of about 0.5 inches to about 3 inches, for example about 2 inches. The length of the delivery line 190 (including the sleeve and the inlet passageways 206, 208) can be 5 inches to about 25 inches, for example about 12 inches. The diameter of the passageways 206, 208 can be selected to optimize the pressure differential between the precursor activator 180 and the processing region 113. In one embodiment, the diameter of each of the passageways 206, 208 is about 0.5 inches to about 2 inches, for example about 0.6 inches for the inlet passageway 208, and about 0.8 inches for the sleeve passageway 206. Either one or both of the passageways 206, 208 can have a diameter gradually decreasing, gradually increasing, or uniform in the direction of flow to promote ion loss. The total length of the interior space 184 and the delivery line 190 is between about 8 inches to about 35 inches, for example about 20 inches.

Figure 4:
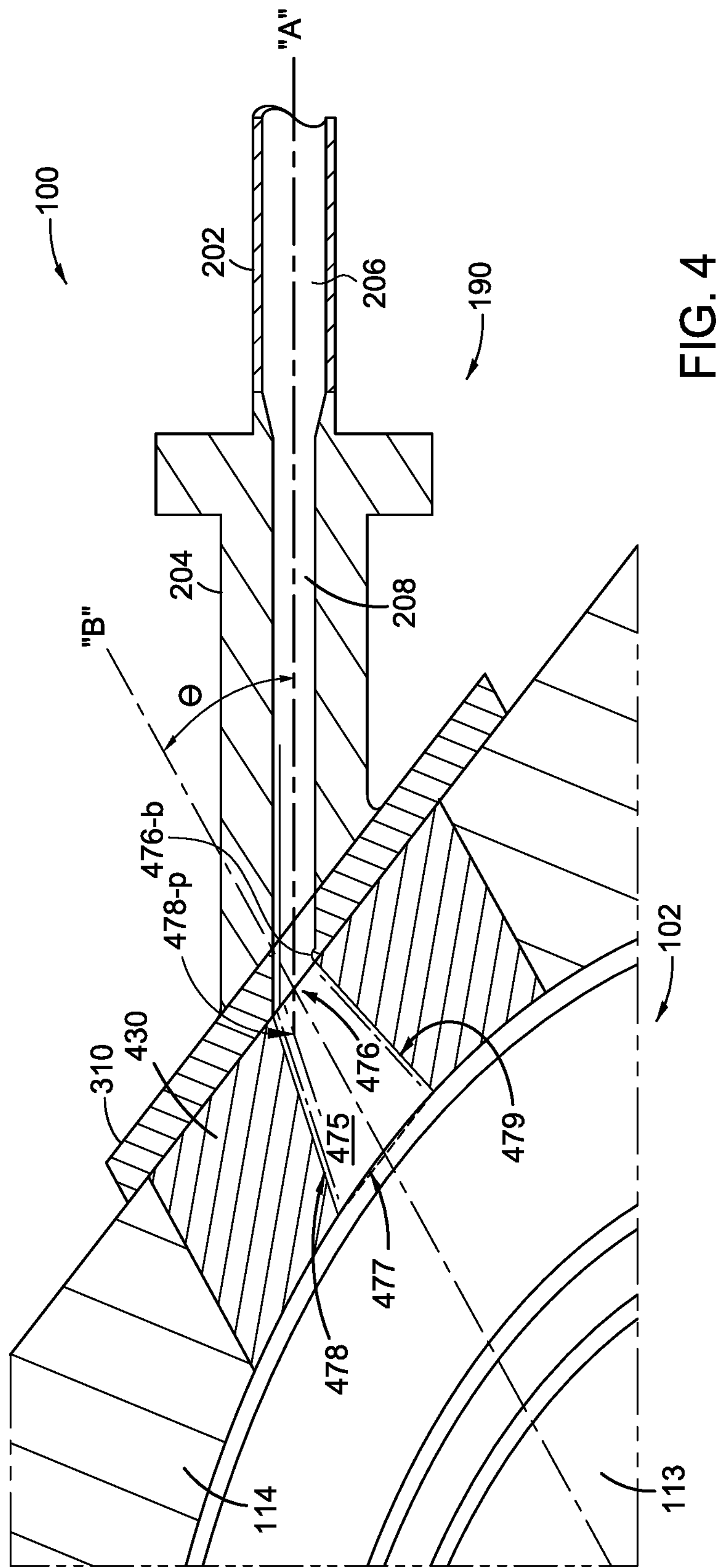
FIG. 4 is a schematic top view of an alternative substrate processing system.

FIG. 4 is a schematic top view of a portion of the substrate processing system 100 proximal to the chamber inlet. As illustrated in FIG. 3, chamber inlet 175 may be generally cylindrical. FIG. 4 illustrates an alternative chamber inlet 475 which is generally an elongated or flattened conical shape. Cassette 430 includes the chamber inlet 475. Chamber inlet 475 is a gas flow passageway from inlet passageway 208 to processing volume 113. Cassette 430 is set into the side wall 114 of chamber 102. As illustrated, the longitudinal profile of chamber inlet 475 generally defines an isosceles triangle (or a portion thereof) centered on longitudinal axis "B" and having sides 478 and 479 of equal length. The longitudinal axis "B" extends along a radius of the processing region 113. The apex of the isosceles triangle lies on the axis "B," and the axis bisects the base of the isosceles triangle. Thus, the altitude of the isosceles triangle is measured along the longitudinal axis "B", and the sides 478 and 479 diverge from the axis "B" at equal angles. Chamber inlet 475 fluidly couples to inlet passageway 208 of inlet member 204 as before, at an opening 476 generally near or at the apex of the isosceles triangle. The lateral dimension of chamber inlet 475 at opening 476 may be about 0.6 inches to about 1.0 inches, for example about 0.8 inches. Chamber inlet 475 is fluidly coupled to processing region 113 at the base of the triangle near or at inner end 477 of the isosceles triangle. The base length of the isosceles triangle may be measured along inner end 477 between intersection points of the sides 478 and 479 with the inner end 477. Chamber inlet 475 may have a cross-sectional area at the inner end 477 that may be any shape, symmetric or asymmetric, including but not limited to, generally oval, ellipsoidal, oblong, stadium, and/or rounded-rectangular in shape. The cross-sectional area at inner end 477 may have a base length about 2.5 inches to about 3.5 inches, for example about 3 inches, and a width about 0.4 inches to about 0.8 inches, for example about 0.6 inches.

The gas outlet 188 (FIG. 2) remains in fluid communication with the chamber 102 through delivery line 190, here coupled to the chamber inlet 475, such that radicals of the activated precursor mixture 183 generated within the interior space 184 are supplied to the processing region 113 of the chamber 102. In some embodiments, the longitudinal profile of chamber inlet 475 defines a scalene triangle, where the sides 478 and 479 have unequal length and diverge at unequal angles from the longitudinal axis "B," such that the longitudinal axis "B" passes through apex, but does not bisect the inner end 477. As before, the diameter of each of the passageways 206, 208 is about 0.5 inches to about 2 inches, for example about 0.6 inches for the inlet passageway 208, and about 0.8 inches for the sleeve passageway 206. It is currently believed that delivery lines 190 having a larger diameter sleeve passageway 206 than inlet passageway 208 may form a choke point at the coupling between the passageways 206, 208. Such choke points may increase pressure in the precursor activator 180 and/or cause or increase volume-surface recombination.

The delivery line 190 is coupled to the chamber inlet 475 with an angled structure, such that longitudinal axis "A" of the inlet passageway 208 and longitudinal axis "B" of the chamber inlet 475 intersect at an angle θ. The angle θ may range between about 10 degrees and about 70 degrees, such as about 20 degrees and about 45 degrees. Longitudinal axis "A" intersects with side 478 of the triangular longitudinal profile of the chamber inlet 475 at a point 478-*p* near opening 476. Having the delivery line 190 positioned at an angle relative to the chamber inlet 475 promotes collision of ions or reaction of ions with electrons or other charged particles during collisions at the interior surface of the chamber inlet 475. Therefore, concentration of ions entering the processing region 113 is reduced, in some cases substantially to zero.

It should be appreciated that cassette 430 (and cassettes 530, 630, 730, discussed below) is set into side wall 114 of chamber 102 much in the same way that chamber inlet 175 traversed the side wall 114 (FIG. 1).

The inlet passageway 208 and/or chamber inlet 475 may be manufactured from a solid piece of quartz with a boring process. In order to accommodate a desired bore depth and/or entry angle, multiple bores may be utilized, resulting in one or more surface irregularities. For example, as can be seen in FIG. 4, the apex of the triangular longitudinal profile of chamber inlet 475 is not a singular point. Rather, a protruding irregularity 476-*b* can be seen at the coupling between the inlet passageway 208 and chamber inlet 475. These irregular features may be convex or concave. Such irregular features are expected to be small (e.g., dimensions of 10% or less) in comparison to the proximal substantial features. For the sake of clarity, discussion about such irregular features will be limited in the remainder of this disclosure. It should be understood, however, that use of terms such as "straight" or "smooth" or similar terms contemplates the presence of small irregular features.

Figure 5:
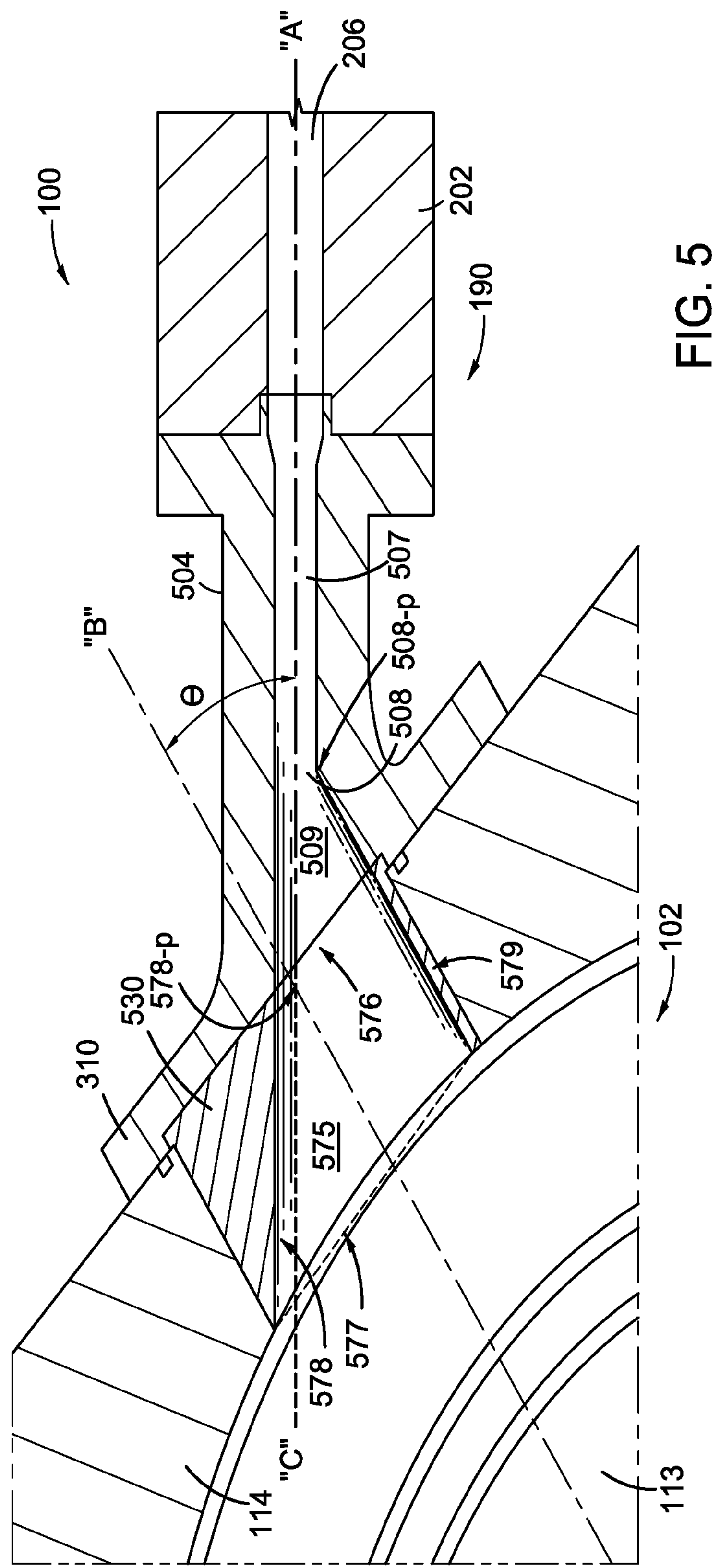
FIG. 5 is a schematic top view of another alternative substrate processing system.

FIG. 5 is another schematic top view of a chamber inlet portion of the substrate processing system 100. As illustrated in FIG. 3, inlet passageway 208 may be generally cylindrical. FIG. 5 illustrates an alternative inlet passageway 508 of inlet member 504, which generally includes a cylindrical portion 507 and a conical portion 509 which is generally an elongated or flattened conical shape. The cylindrical portion 507 may transition to the conical portion 509 such that the cross-sectional area of inlet passageway 508 monotonically increases from the coupling with the mounting sleeve 202 to the coupling with the chamber 102. As illustrated, the transition from cylindrical portion 507 to conical portion 509 may create a transition point 508-*p* that may appear as a corner or angle in a wall of the inlet passageway 508. Mounting sleeve 202 is connected to the inlet member 504 so that the cylindrical portion 507 of inlet passageway 508 is substantially aligned with, and fluidly coupled to, the sleeve passageway 206 of the mounting sleeve 202.

FIG. 5 illustrates an alternative chamber inlet 575 having a longitudinal profile that generally defines a trapezoidal shape. Cassette 530 includes the chamber inlet 575. Cassette 530 is set into the side wall 114 of chamber 102. Longitudinal axis "B" extends along a radius of the processing region 113 and bisects inner end 577 of the trapezoid. The base length of the trapezoid may be measured along inner end 577. The altitude of the trapezoid may be measured along longitudinal axis "B". Chamber inlet 575 is connected to the inlet member 504 so that the conical portion 509 of inlet passageway 508 is substantially aligned with, and fluidly coupled to, an outer end 576 of the trapezoidal longitudinal profile of the chamber inlet 575. The top length of the trapezoid may be measured along outer end 576. The top length of the trapezoid may be less than or equal to the base length thereof. Chamber inlet 575 may have a cross-sectional area at outer end 576 that may be any shape, symmetric or asymmetric, including but not limited to, generally oval, ellipsoidal, oblong, stadium, and/or rounded-rectangular in shape. Chamber inlet 575 is coupled and fluidly connected to processing region 113 at the inner end 577 of the trapezoid. Chamber inlet 575 may have a cross-sectional area at inner end 577 that may be any shape, symmetric or asymmetric, including but not limited to, generally oval, ellipsoidal, oblong, stadium, and/or rounded-rectangular in shape. The cross-sectional area at outer end 576 may be less than or equal to the cross-sectional area at inner end 577. A wall of conical portion 509 may align with side 579 of chamber inlet 575. For example, a wall of conical portion 509 of inlet passageway 508 may align with side 579 of chamber inlet 575 to form a smooth, linear surface from point 508-*p* to inner end 577. In some embodiments, the smooth, linear surface aligns with a radius passing through the center of the processing region 113. In the illustrated embodiment, side 579 of the trapezoidal longitudinal profile of the chamber inlet 575 makes a right angle with both outer end 576 and inner end 577. In other embodiments, side 579 may make an angle with outer end 576 and/or inner end 577 between about 75° and about 105°.

The delivery line 190 is coupled to the chamber inlet 575 with an angled structure, such that longitudinal axis "A" of the cylindrical portion 507 of inlet passageway 508 and longitudinal axis "B" of the chamber inlet 575 intersect at an angle θ. The angle θ may range between about 10 degrees and about 70 degrees, such as about 20 degrees and about 45 degrees. In some embodiments, longitudinal axis "A" parallels and aligns with an axis "C" of side 578 of the trapezoidal longitudinal profile of the chamber inlet 575. In other embodiments (not shown), longitudinal axis "A" makes an angle with axis "C" between about 160° and about 200°. In embodiments wherein longitudinal axis "A" makes an angle of less than about 180° with axis "C", longitudinal axis "A" intersects with side 578 of the trapezoidal longitudinal profile of the chamber inlet 575 at a point 578-*p* near outer end 576. In embodiments wherein longitudinal axis "A" makes an angle of greater than about 180° with axis "C", longitudinal axis "A" will not intersect with side 578 of the trapezoid. Having the delivery line 190 positioned at an angle relative to the chamber inlet 575 promotes collision of ions or reaction of ions with electrons or other charged particles during collisions at the interior surface of the chamber inlet 575. Therefore, concentration of ions entering the processing region 113 is reduced, in some cases substantially to zero.

It should be appreciated that inlet member 504 couples to mounting sleeve 202 in the same way that inlet member 204 couples to mounting sleeve 202. Therefore, it is expected that mounting sleeve 202 may undergo few, if any, modifications to accommodate inlet member 504.

Figure 6:
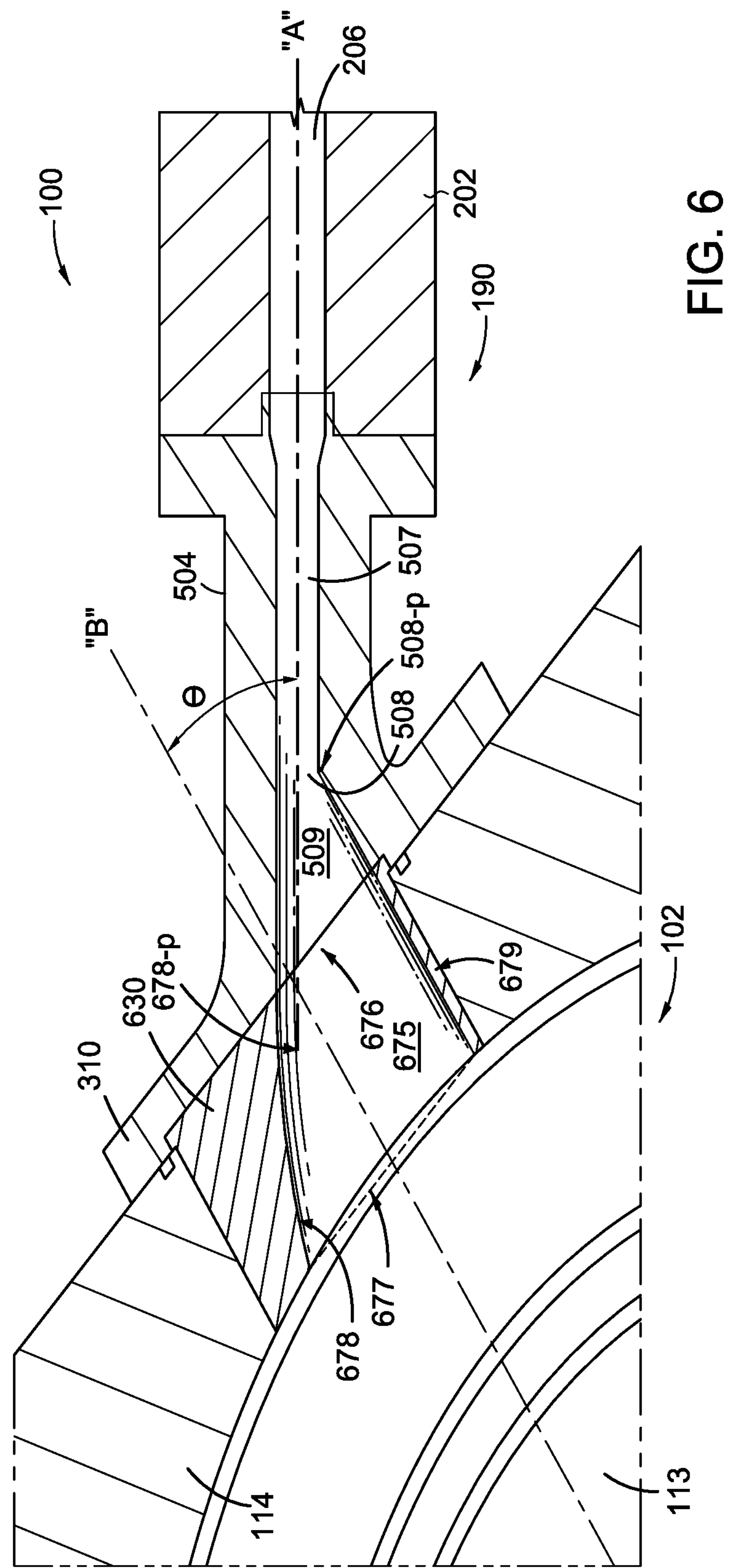
FIG. 6 is a schematic top view of another alternative substrate processing system.

FIG. 6 is another schematic top view of a portion of the substrate processing system 100 proximal to the chamber inlet. FIG. 6 illustrates an alternative chamber inlet 675 having a longitudinal profile that generally defines a modified trapezoidal shape, having a curved side 678. Cassette 630 includes the chamber inlet 675. Cassette 630 is set into the side wall 114 of chamber 102. Curved side 678 aligns with a wall of conical portion 509 at outer end 676, and curved side 678 curves inwardly towards side 679 as it nears inner side 677. Longitudinal axis "B" extends along a radius of the processing region 113 and bisects inner end 677. The base length of the modified trapezoid may be measured along inner end 677. The altitude of the modified trapezoid may be measured along longitudinal axis "B". Chamber inlet 675 is connected to the inlet member 504 so that the conical portion 509 of inlet passageway 508 is substantially aligned with, and fluidly coupled to, an outer end 676 of the modified trapezoidal longitudinal profile of the chamber inlet 675. The top length of the modified trapezoid may be measured along outer end 676. The top length of the modified trapezoid may be less than or equal to the base length thereof. Note that, in comparison to chamber inlet 575, the base length measured along inner end 677 may be smaller than the base length measured along inner end 577 due to the intrusion of curved side 678. Chamber inlet 675 may have a cross-sectional area at outer end 676 that may be any shape, symmetric or asymmetric, including but not limited to, generally oval, ellipsoidal, oblong, stadium, and/or rounded-rectangular in shape. Chamber inlet 675 is coupled and fluidly connected to processing region 113 at the inner end 677 of the modified trapezoid. Chamber inlet 675 may have a cross-sectional area at inner end 677 that may be any shape, symmetric or asymmetric, including but not limited to, generally oval, ellipsoidal, oblong, stadium, and/or rounded-rectangular in shape. The cross-sectional area at outer end 676 may be less than or equal to the cross-sectional area at inner end 677. A wall of conical portion 509 may align with side 679 of chamber inlet 675. For example, a wall of conical portion 509 of inlet passageway 508 may align with side 679 of chamber inlet 675 to form a smooth, linear surface from point 508-*p* to inner end 677. In some embodiments, the smooth, linear surface aligns with a radius passing through the center of the processing region 113. In the illustrated embodiment, side 679 of the modified trapezoidal longitudinal profile of the chamber inlet 675 makes a right angle with both outer end 676 and inner end 677. In other embodiments, side 679 may make an angle with outer end 676 and/or inner end 677 between about 75° and about 105°.

The delivery line 190 is coupled to the chamber inlet 675 with an angled structure, such that longitudinal axis "A" of the cylindrical portion 507 of inlet passageway 508 and longitudinal axis "B" of the chamber inlet 675 intersect at an angle θ. The angle θ may range between about 10 degrees and about 70 degrees, such as about 20 degrees and about 45 degrees. The curvature of curved side 678 may, at least in part, determine the point 678-*p* where longitudinal axis "A" of the cylindrical portion 507 of inlet passageway 508 intersects with curved side 678. For example, when curved side 678 is only slightly curved, longitudinal axis "A" intersects with curved side 678 near inner end 677. When curved side 678 has a larger curvature, longitudinal axis "A" intersects with curved side 678 near outer end 676. Measured along longitudinal axis "B", point 678-*p* may be between about 10% and about 60% of the altitude of the modified trapezoid from outer end 676. Having the delivery line 190 positioned at an angle relative to the chamber inlet 675 promotes collision of ions or reaction of ions with electrons or other charged particles during collisions at the interior surface of the chamber inlet 675. Therefore, concentration of ions entering the processing region 113 is reduced, in some cases substantially to zero.

Figure 7:
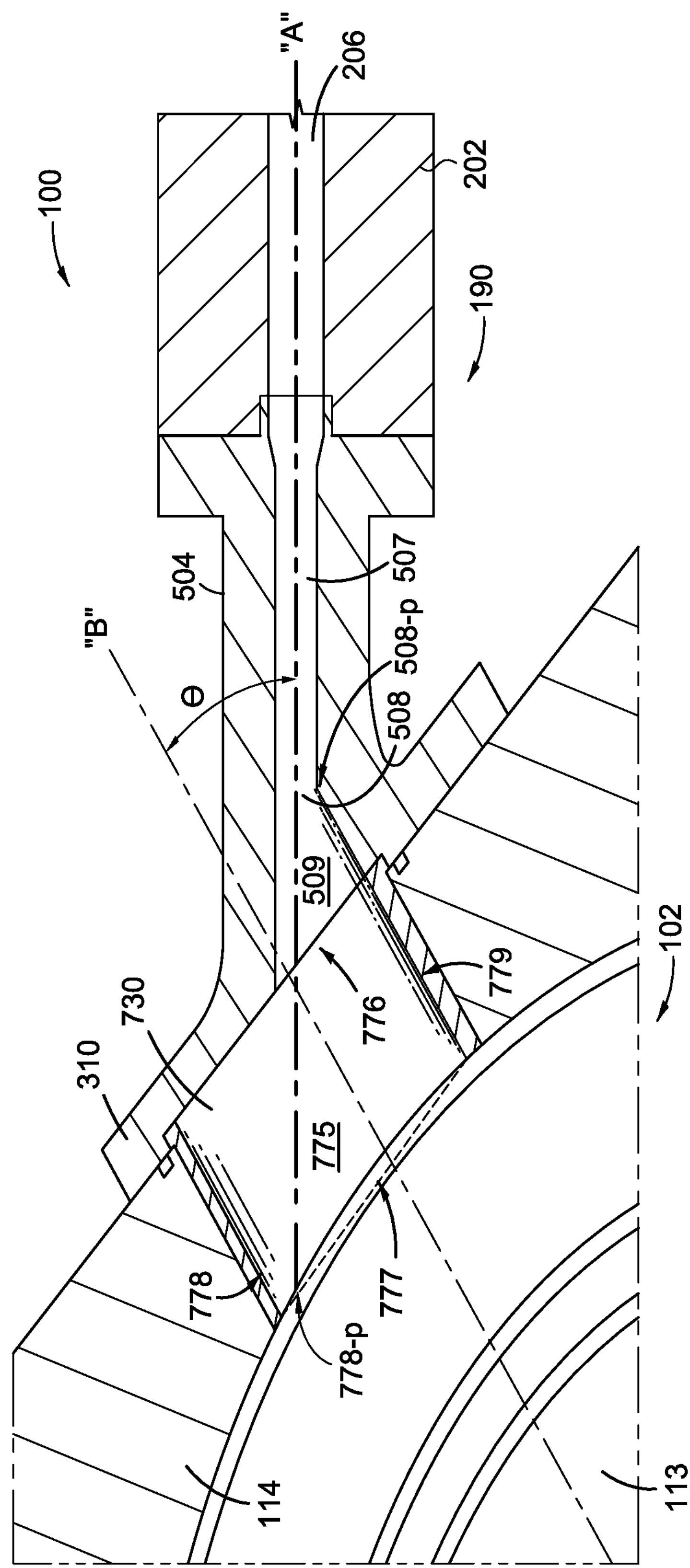
FIG. 7 is a schematic top view of another alternative substrate processing system.

FIG. 7 is another schematic top view of a portion of the substrate processing system 100 proximal to the chamber inlet. FIG. 7 illustrates an alternative chamber inlet 775 having a longitudinal profile that generally defines a rectangular shape. Cassette 730 includes the chamber inlet 775. Cassette 730 is set into the side wall 114 of chamber 102. Longitudinal axis "B" extends along a radius of the processing region 113 and bisects inner end 777. The base length of the rectangle may be measured along inner end 777. The altitude of the rectangle may be measured along longitudinal axis "B". Chamber inlet 775 is connected to the inlet member 504 so that the conical portion 509 of inlet passageway 508 is substantially aligned with, and fluidly coupled to, a portion of outer end 776 of the rectangular longitudinal profile of the chamber inlet 775. The top length of the rectangle may be measured along outer end 776, from side 778 to side 779. The top length of the rectangle may be equal to the base length thereof. Chamber inlet 775 may have a cross-sectional area at outer end 776 that may be any shape, symmetric or asymmetric, including but not limited to, generally oval, ellipsoidal, oblong, stadium, and/or rounded-rectangular in shape. Chamber inlet 775 is coupled and fluidly connected to processing region 113 at the inner end 777 of the rectangle. Chamber inlet 775 may have a cross-sectional area at inner end 777 that may be any shape, symmetric or asymmetric, including but not limited to, generally oval, ellipsoidal, oblong, stadium, and/or rounded-rectangular in shape. The cross-sectional area of the coupling at outer end 776 may be less than or equal to the cross-sectional area at inner end 777. Note that, in comparison to chamber inlets 575 and 675, the cross-sectional area of inner end 777 may be about equal to the cross-sectional area of inner end 577, and may be larger than the cross-sectional area of inner end 677. A wall of conical portion 509 may align with side 779 of chamber inlet 775. For example, a wall of conical portion 509 of inlet passageway 508 may align with side 779 of chamber inlet 775 to form a smooth, linear surface from point 508-*p* to inner end 777. In some embodiments, the smooth, linear surface aligns with a radius passing through the center of the processing region 113. In the illustrated embodiment, side 779 of the rectangular longitudinal profile of the chamber inlet 775 makes a right angle with both outer end 776 and inner end 777. In other embodiments, side 779 may make an angle with outer end 776 and/or inner end 777 between about 75° and about 105°. In still other embodiments, both sides 778 and 779 may make an angle with outer end 776 and/or inner end 777 between about 75° and about 105°, thereby creating a rhomboidal longitudinal profile of the chamber inlet 775.

The delivery line 190 is coupled to the chamber inlet 775 with an angled structure, such that longitudinal axis "A" of the cylindrical portion 507 of inlet passageway 508 and longitudinal axis "B" of the chamber inlet 775 intersect at an angle θ. The angle θ may range between about 10 degrees and about 70 degrees, such as about 20 degrees and about 45 degrees. In some embodiments, the altitude of the trapezoidal longitudinal profile of chamber inlet 575 is about equal to the altitude of rectangular longitudinal profile of chamber inlet 775, and the base length measured along inner end 577 is about equal to the base length measured along inner end 777. In such embodiments, it should be understood that longitudinal axis "A" of the cylindrical portion 507 of inlet passageway 508 may not intersect with side 778, or may only intersect with side 778 at a point (e.g., point 778-*p*) near or at inner end 777. In some embodiments, wherein the base length measured along inner end 777 is less than the base length measured along inner end 577, longitudinal axis "A" may intersect with side 778 at a point substantially away from inner end 777. Having the delivery line 190 positioned at an angle relative to the chamber inlet 775 promotes collision of ions or reaction of ions with electrons or other charged particles during collisions at the interior surface of the chamber inlet 775. Therefore, concentration of ions entering the processing region 113 is reduced, in some cases substantially to zero.

Other configurations of deliver line 190 and chamber 102 may be envisioned that provide similar benefits. When the precursor activator 180 is coupled to the chamber 102, the gas outlet 188 is in fluid communication with the chamber 102 through a delivery line 190 to a chamber inlet (e.g., chamber inlets 175, 475, 575, 675, 775), such that radicals of the activated precursor mixture 183 generated within the interior space 184 are supplied to the processing region 113 of the chamber 102. Each configuration may include an inlet member (e.g., inlet members 204, 504) that acts as an adapter, fluidly coupling a tubular sleeve passageway 206 of a mounting sleeve 202 to a chamber inlet of chamber 102. The diameter and/or interior volume of the inlet member may be selected to optimize the pressure differential between the precursor activator 180 and the processing region 113. The pressure differential may be selected to yield a composition of ions, radicals, and molecules flowing in to the chamber 102 that is suitable to processes being performed in the chamber 102. Each configuration may also include a chamber inlet that receives and distributes processing gas to the processing region 113 of the chamber 102. The delivery line 190 may be positioned at an angle relative to the chamber inlet. For example, a longitudinal axis "A" of the delivery line 190 may be positioned at an angle θ to the longitudinal axis "B" of the chamber inlet, wherein the longitudinal axis "B" extends along a radius of the processing region 113 and generally crosses a midpoint (e.g. a bisection point) of an inner end (e.g., base) of a longitudinal profile (e.g., triangular, modified triangular, trapezoidal, modified trapezoidal, rectangular, modified rectangular, rhomboidal, modified rhomboidal) of the chamber inlet. Positioning the delivery line 190 at an angle relative to the chamber inlet promotes collision of ions or reaction of ions with electrons or other charged particles during collisions at the interior surface of the chamber inlet. Therefore, concentration of ions entering the processing region 113 is reduced, in some cases substantially to zero.

Experimental Results

Figure 8:
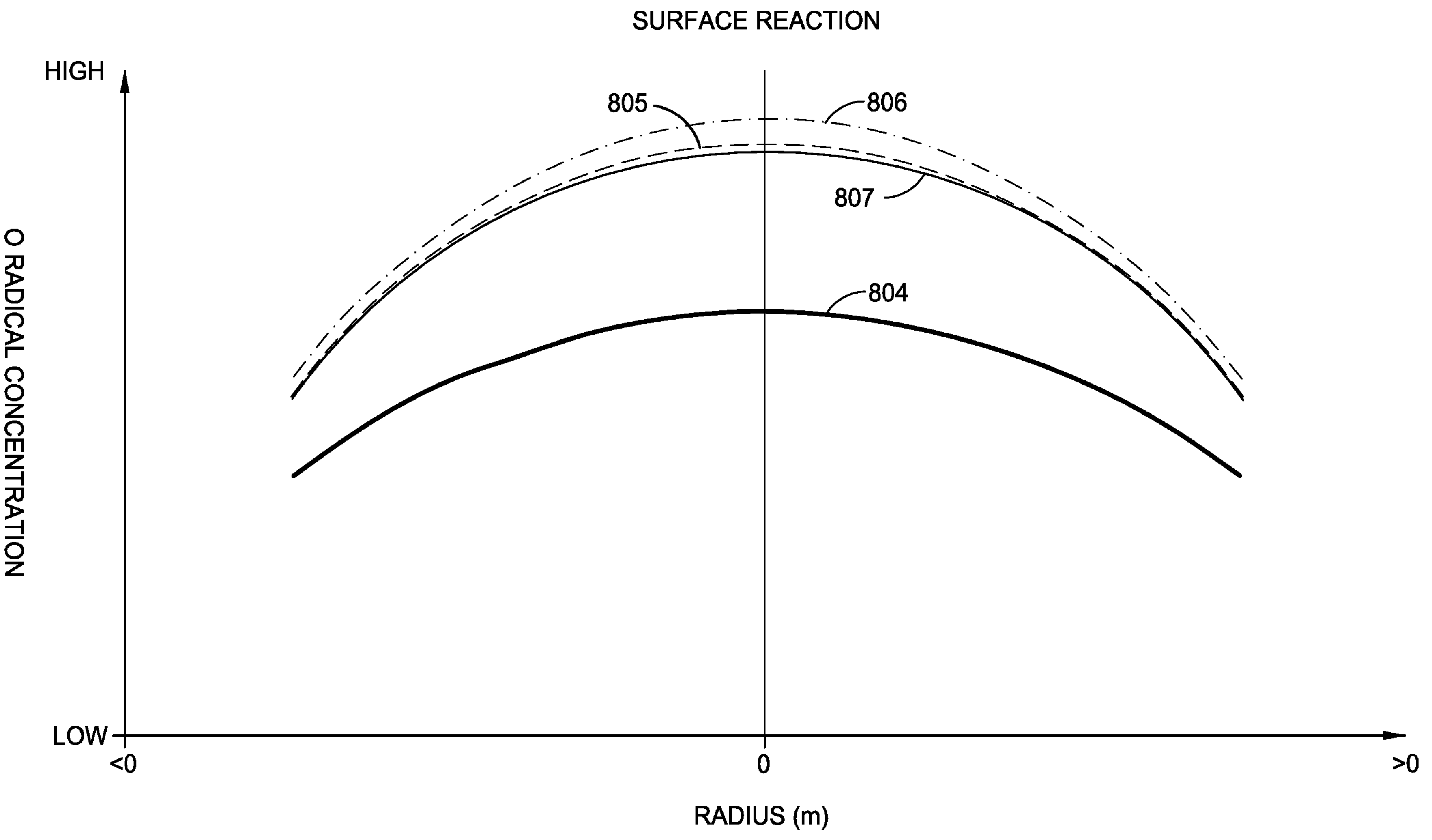
FIG. 8 is a graph of results of modeling experiments for the substrate processing systems of FIGS. 4-7 illustrating Surface Reactions as measured by O Radical Concentrations at various points on the surface of a substrate.
Figure 9:
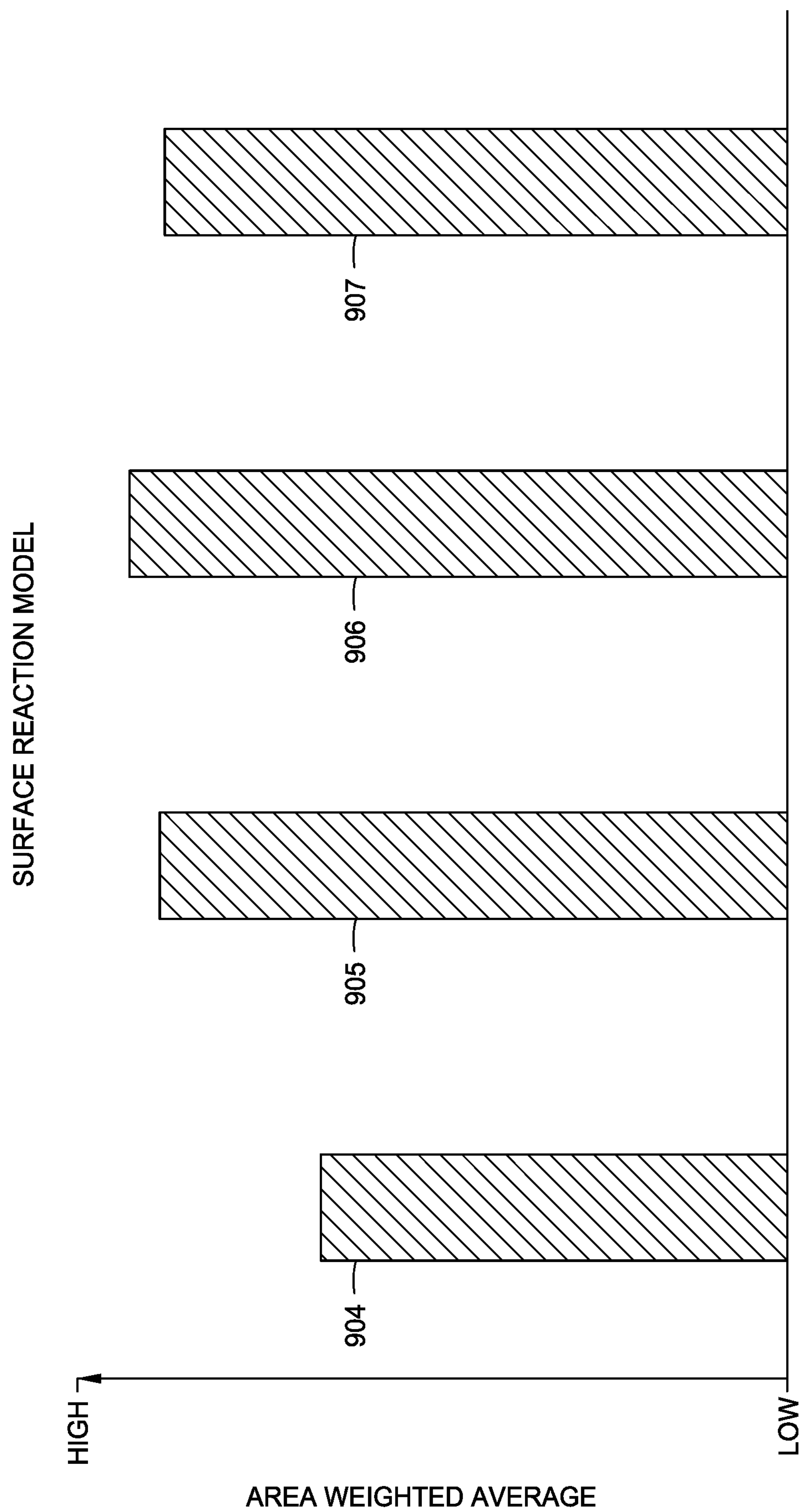
FIG. 9 is a graph of results of modeling experiments for the substrate processing systems of FIGS. 4-7 illustrating Area Weighted Average of O Radical Concentrations.

Hardware and components as illustrated in FIGS. 4-7 have been tested with simulation scenarios. To get additional confidence over the simulation results, 3D models of the same have been validated with experiments in terms of flow trends and overall O* radical area weighted average trends with pressure and flow variations. FIG. 8 is a graph of results of the modeling experiments illustrating Surface Reactions as measured by O Radical Concentrations at various points on the surface of a substrate in a chamber 102 of a substrate processing system 100. Results 804 are from a model of substrate processing system 100 illustrated in FIG. 4, having an inlet member 204 (i.e., generally cylindrical inlet passageway) and chamber inlet 475 (i.e., generally triangular longitudinal profile). Results 805 are from a model of substrate processing system 100 illustrated in FIG. 5, having an inlet member 504 (i.e., inlet passageway having a generally cylindrical portion and a generally conical portion) and chamber inlet 575 (i.e., generally trapezoidal longitudinal profile). Results 806 are from a model of substrate processing system 100 illustrated in FIG. 6, having an inlet member 504 and chamber inlet 675 (i.e., modified trapezoidal longitudinal profile). Results 807 are from a model of substrate processing system 100 illustrated in FIG. 7, having an inlet member 504 and chamber inlet 775 (i.e., generally rectangular longitudinal profile). FIG. 9 is a graph of results illustrating Area Weighted Average of O Radical Concentrations of each model. Results 904 are from a model of substrate processing system 100 illustrated in FIG. 4, having an inlet member 204 and chamber inlet 475. Results 905 are from a model of substrate processing system 100 illustrated in FIG. 5, having an inlet member 504 and chamber inlet 575. Results 906 are from a model of substrate processing system 100 illustrated in FIG. 6, having an inlet member 504 and chamber inlet 675. Results 907 are from a model of substrate processing system 100 illustrated in FIG. 7, having an inlet member 504 and chamber inlet 775. As can be seen in each graph, the model having an inlet member 504 and chamber inlet 675 provides the highest O radical concentration at in the processing volume. It is currently believed that increasing the interior cross-sectional areas of the inlet member and the coupling to the chamber inlet may reduce back pressure at the exit of the RPS by as much as 50%. Moreover, reducing the back pressure may help to increase in O radical concentration over the wafer due to less gas phase recombination.

Experimental modeling draws comparisons of the velocity at the point of entry in the chamber (above the wafer) between the substrate processing system 100 illustrated in FIGS. 4-7 The modeling shows that the velocity is lower in the models of FIGS. 5-7. This may help to better spread the gas over the wafer, which will result in increase of O radicals over the wafer.

Experimental modeling draws comparison of the velocity on the cutting plane of the chamber between the substrate processing system 100 illustrated in FIGS. 4-7 The modeling indicates that, due to the direct line of sight from RPS to chamber (along longitudinal axis "A") in the substrate processing system 100 of FIG. 4, only a portion of cone has been utilized, and the other half is getting the flow back from chamber. These velocity contours indicate that modifying the inlet member geometry may help to reduce the velocity at point of entry in the chamber, which will lead better flow and higher O* radical concentration over the wafer.

These experimental results indicate that the disclosed configurations of the inlet member and chamber inlet improve the availability of radicals over wafer by reducing or minimizing the volume-surface recombinations. In particular, experimental results indicate that the configuration disclosed in FIG. 6, having an inlet member 504 (i.e., inlet passageway having a generally cylindrical portion and a generally conical portion) and chamber inlet 675 (i.e., modified trapezoidal longitudinal profile), provides a oxide growth rate of 17.2% higher than that observed for the configuration disclosed in FIG. 4.

These experimental results indicate that increased cross-sectional area from the delivery-line end of the chamber inlet to the processing-volume end reduces O* radical volume-surface recombination and/or increases oxide growth rate during substrate processing. These experimental results indicate that utilizing chamber inlets and/or inlet members as described herein can improve wafer uniformity.

Figure 10:
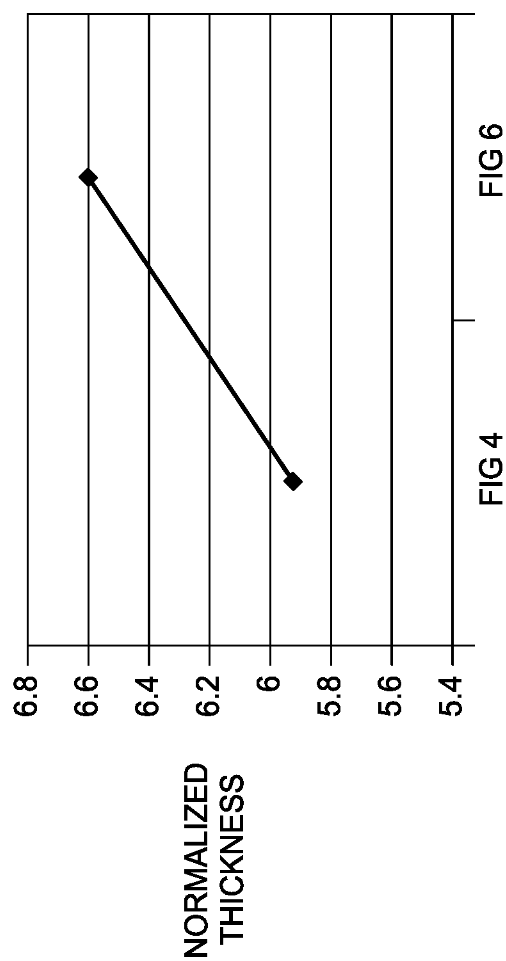
FIG. 10 illustrates representative results of oxide growth rate experiments.

Additionally experimental results indicate that oxide growth rate may be improved, and/or oxide thickness may be increased for the same processing time. FIG. 10 illustrates representative results of oxide growth rate experiments. The Y-axis shows oxide thickness for same process times. Results for the configuration of FIG. 4 are shown on the left, and results for the configuration of FIG. 6 are shown on the right.

In an embodiment, a substrate processing system includes a delivery line coupled between a processing chamber and a remote plasma source; the processing chamber comprising a side wall; and a chamber inlet assembly set into the side wall, the chamber inlet assembly including a chamber inlet; an outer coupling to the delivery line; an inner coupling for a processing region of the processing chamber, the inner coupling and the outer coupling being on inner and outer ends, respectively, of the chamber inlet, wherein a cross-sectional area of the inner coupling is larger than a cross-sectional area of the outer coupling; a longitudinal profile comprising the inner and outer ends and a first side and a second side, the first and second sides being on opposite sides of the chamber inlet, wherein a shape of the longitudinal profile comprises at least one of triangular, modified triangular, trapezoidal, modified trapezoidal, rectangular, modified rectangular, rhomboidal, modified rhomboidal; and a cassette including the chamber inlet and configured to set into the side wall.

In one or more embodiments disclosed herein, a chamber inlet longitudinal axis extends from a center of the processing region, through the inner end, and to the outer coupling, a delivery line longitudinal axis, parallel to the delivery line, extends from the delivery line and through the outer coupling, and the chamber inlet longitudinal axis makes an angle with the delivery line longitudinal axis of between 10 degrees and 70 degrees.

In one or more embodiments disclosed herein, the deliver line longitudinal axis intersects with the first side at a point between the inner end and the outer end.

In one or more embodiments disclosed herein, the first side is curved.

In one or more embodiments disclosed herein, the first side aligns with the delivery line at the outer coupling and curves towards the second side as it nears the inner coupling.

In one or more embodiments disclosed herein, the first side is straight and aligns with an interior wall of the delivery line.

In one or more embodiments disclosed herein, the first side is straight and makes an angle of less than 180° with an interior wall of the delivery line.

In one or more embodiments disclosed herein, a length of the outer coupling is less than a length of the outer end.

In one or more embodiments disclosed herein, the cross-sectional area of the inner coupling being larger than the cross-sectional area of the outer coupling reduces volume-surface recombination during substrate processing.

In one or more embodiments disclosed herein, the cross-sectional area of the inner coupling being larger than the cross-sectional area of the outer coupling increases oxide growth rate during substrate processing.

In an embodiment, a substrate processing system includes a processing chamber; and a delivery line coupled between the processing chamber and a precursor activator, the delivery line including a mounting sleeve coupled to the precursor activator; and an inlet member, the inlet member including a first end for coupling to the mounting sleeve; a second end for coupling to the processing chamber; and an inlet passageway extending from the first end to the second end, wherein: the inlet passageway comprises a cylindrical portion proximate the first end, the inlet passageway comprises a conical portion proximate the second end, and a first cross-sectional area at the first end is less than a second cross-sectional area at the second end.

In one or more embodiments disclosed herein, an interior wall of the inlet passageway comprises an angle where the cylindrical portion transitions to the conical portion.

In one or more embodiments disclosed herein, the substrate processing system further includes a chamber inlet set into a side wall of the processing chamber, the chamber inlet including an outer coupling to the delivery line; an inner coupling for a processing region of the processing chamber, the inner coupling and the outer coupling being on inner and outer ends, respectively, of the chamber inlet; and a longitudinal profile comprising the inner and outer ends and a first side and a second side, the first and second sides being on opposite sides of the chamber inlet, wherein a wall of the conical portion aligns with the second side of the chamber inlet to form a linear surface from the angle the to the inner end.

While the foregoing is directed to implementations of the present disclosure, other and further implementations of the disclosure may be devised without departing from the basic scope thereof, and the scope thereof is determined by the claims that follow.

What is claimed is:

1. A chamber inlet assembly for a substrate processing system comprising:

a chamber inlet;

an outer coupling for a delivery line;

an inner coupling for a processing region of a processing chamber, the inner coupling and the outer coupling being on inner and outer ends, respectively, of the chamber inlet, and configured to reduce back pressure to the delivery line, wherein:

a cross-sectional area of the inner coupling is larger than a cross-sectional area of the outer coupling, a chamber inlet longitudinal axis extends from a center of the processing region, through the inner end, and to the outer end, and the outer coupling is asymmetric with respect to the chamber inlet longitudinal axis;

a longitudinal profile comprising the inner and outer ends and a first side and a second side, the first and second sides being on opposite sides of the chamber inlet, wherein a shape of the longitudinal profile comprises at least one of triangular, modified triangular, trapezoidal, modified trapezoidal, rectangular, modified rectangular, rhomboidal, and modified rhomboidal; and a cassette including the chamber inlet and configured to set into a side wall of the processing chamber.

2. The chamber inlet assembly of claim 1, wherein:

a delivery line longitudinal axis, parallel to the delivery line, extends from the delivery line and through the outer coupling, and the chamber inlet longitudinal axis makes an angle with the delivery line longitudinal axis of between 10 degrees and 70 degrees.

3. The chamber inlet assembly of claim 2, wherein the deliver line longitudinal axis intersects with the first side, if at all, at a point near the inner end.

4. The chamber inlet assembly of claim 1, wherein the first side is curved.

5. The chamber inlet assembly of claim 4, wherein the first side aligns with the delivery line at the outer coupling and curves towards the second side as the first side nears the inner coupling.

6. The chamber inlet assembly of claim 1, wherein the first side is straight and aligns with an interior wall of the delivery line.

7. The chamber inlet assembly of claim 1, wherein the first side is straight and makes an angle of less than 180° with an interior wall of the delivery line.

8. The chamber inlet assembly of claim 1, wherein a length of the outer coupling is less than a length of the outer end.

9. An inlet member for a delivery line for a substrate processing system comprising:

a first end for coupling to a mounting sleeve of the delivery line;

a second end for coupling to a processing chamber; and an inlet passageway extending from the first end to the second end, wherein:

the inlet passageway comprises a cylindrical portion proximate the first end, the inlet passageway comprises a conical portion proximate the second end, the conical portion configured to mitigate flow choke points within the inlet passageway, and a first cross-sectional area at the first end is less than a second cross-sectional area at the second end.

10. The inlet member of claim 9, wherein an interior cross-sectional area monotonically increases from the first end of the inlet passageway to the second end of the inlet passageway.

11. The inlet member of claim 9, wherein an interior wall of the inlet passageway comprises an angle where the cylindrical portion transitions to the conical portion.

12. The inlet member of claim 9, wherein a shape of the second cross-sectional area comprises at least one of oval, ellipsoidal, oblong, stadium, rounded-rectangular, asymmetric, and irregular.

13. A substrate processing system comprising:

a delivery line coupled between a processing chamber and a remote plasma source, the delivery line comprising:

a mounting sleeve coupled to the remote plasma source; and an inlet member, the inlet member comprising:

a first end for coupling to the mounting sleeve;

a second end for coupling to the processing chamber; and an inlet passageway extending from the first end to the second end, wherein:

the inlet passageway comprises a cylindrical portion proximate the first end, the inlet passageway comprises a conical portion proximate the second end, the conical portion configured to mitigate flow choke points within the inlet passageway, and a first cross-sectional area at the first end is less than a second cross-sectional area at the second end.

14. The substrate processing system of claim 13, wherein an interior wall of the inlet passageway comprises an angle where the cylindrical portion transitions to the conical portion.

15. The substrate processing system of claim 13, further comprising a chamber inlet set into a side wall of the processing chamber, the chamber inlet comprising:

an outer coupling to the delivery line;

an inner coupling for a processing region of the processing chamber, the inner coupling and the outer coupling being on inner and outer ends, respectively, of the chamber inlet; and a longitudinal profile comprising the inner and outer ends and a first side and a second side, the first and second sides being on opposite sides of the chamber inlet, wherein a wall of the conical portion aligns with the second side of the chamber inlet to form a linear surface from the angle the to the inner end.

16. The substrate processing system of claim 15, wherein a longitudinal axis of the deliver line intersects with the first side, if at all, at a point near the inner end.

17. The substrate processing system of claim 13, wherein the first side is curved.

18. The substrate processing system of claim 17, wherein the first side aligns with the delivery line at the outer coupling and curves towards the second side as the first side nears the inner coupling.

19. The substrate processing system of claim 13, wherein the first side is straight and aligns with an interior wall of the delivery line.

20. The substrate processing system of claim 13, wherein the first side is straight and makes an angle of less than 180° with an interior wall of the delivery line, and wherein a length of the outer coupling is less than a length of the outer end.

* * * * *